United States Patent [19]

Seo

[11] Patent Number: 5,969,377
[45] Date of Patent: Oct. 19, 1999

[54] LIQUID CRYSTAL DISPLAY DEVICE INTEGRATED WITH DRIVING CIRCUIT AND METHOD FOR FABRICATING THE SAME

[75] Inventor: Seong Moh Seo, Anyang-shi, Rep. of Korea

[73] Assignee: LG Electronics Inc., Seoul, Rep. of Korea

[21] Appl. No.: 08/854,463

[22] Filed: May 12, 1997

[30] Foreign Application Priority Data

May 11, 1996 [KR] Rep. of Korea ...................... 96-15699

[51] Int. Cl.$^6$ .......................... H01L 29/04; H01L 31/036; H01L 31/112; H01L 27/01
[52] U.S. Cl. .................................. 257/72; 257/59; 257/66; 257/350; 257/351
[58] Field of Search .................................. 257/72, 57, 59, 257/66, 350, 351

[56] References Cited

U.S. PATENT DOCUMENTS 5,877,514 3/1999 Seo ............................................. 257/72

Primary Examiner—Steven H. Loke
Attorney, Agent, or Firm—Morgan, Lewis & Bockius LLP

[57] ABSTRACT

A thin film transistor substrate integrated with a driver circuit is provided for use in a liquid crystal display. The thin film transistor substrate includes a substrate having a pixel region and a driver region, a plurality of pixel driving thin film transistors formed in the pixel region, and a CMOS thin film transistor circuit formed in the driver region. Each of the plurality of pixel driving thin film transistors includes a channel region formed of an amorphous semiconductor, source and drain regions in contact with the channel region and formed of a polycrystalline semiconductor, and first and second transparent electrodes in contact with the source and drain regions, respectively. The CMOS thin transistor circuit includes a P-type thin film transistor and an N-type thin film transistor. Each of the P-type and N-type thin film transistors includes a channel region formed of a polycrystalline semiconductor and source and drain regions in contact with the channel region and formed of a polycrystalline semiconductor. Each of the P-type and N-type thin film transistors further includes third and fourth transparent electrodes in contact with the source and drain regions of the corresponding type thin film transistor, respectively, and source and drain electrodes in contact with the third and fourth transparent electrodes, respectively.

7 Claims, 7 Drawing Sheets

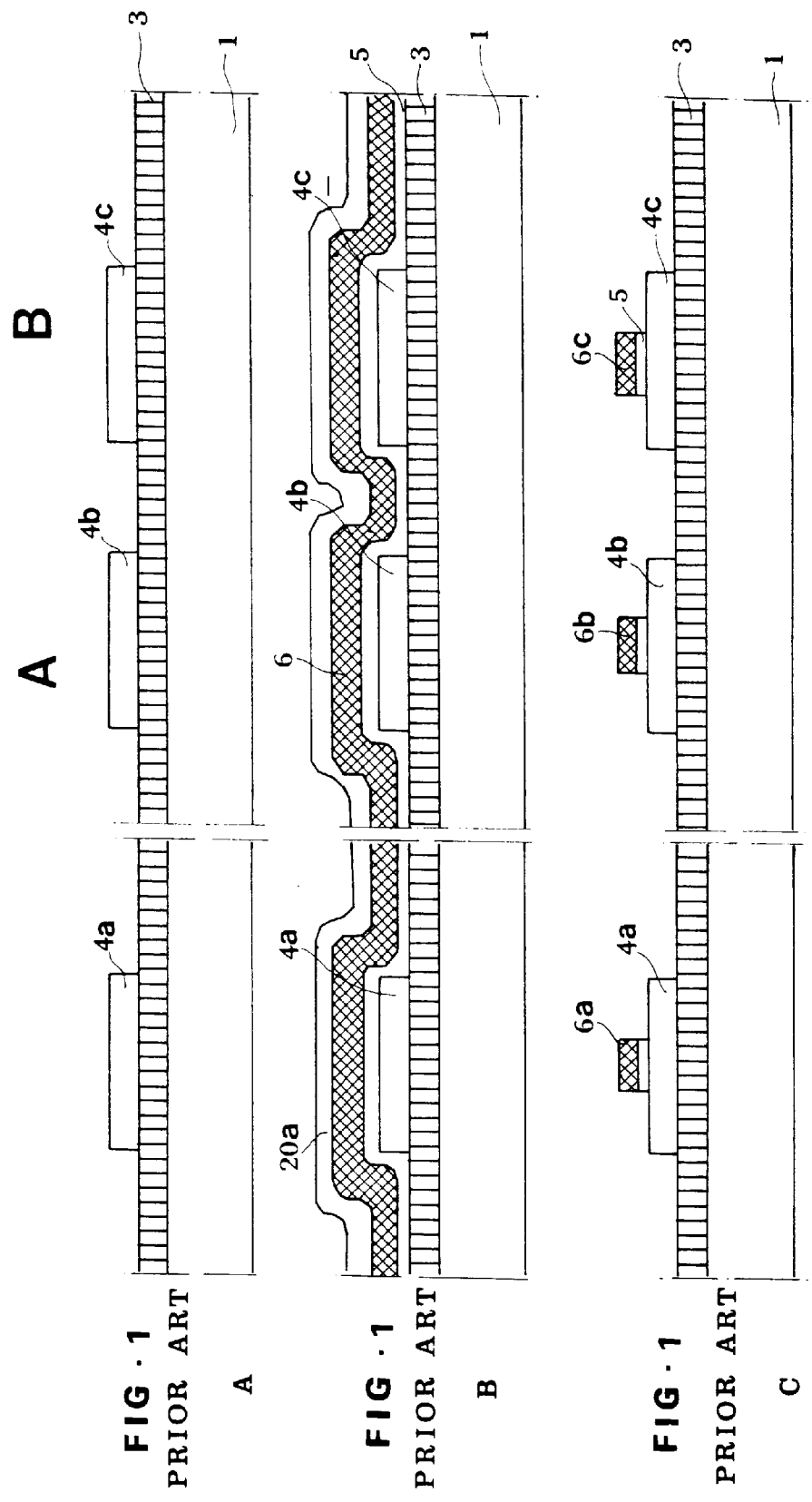

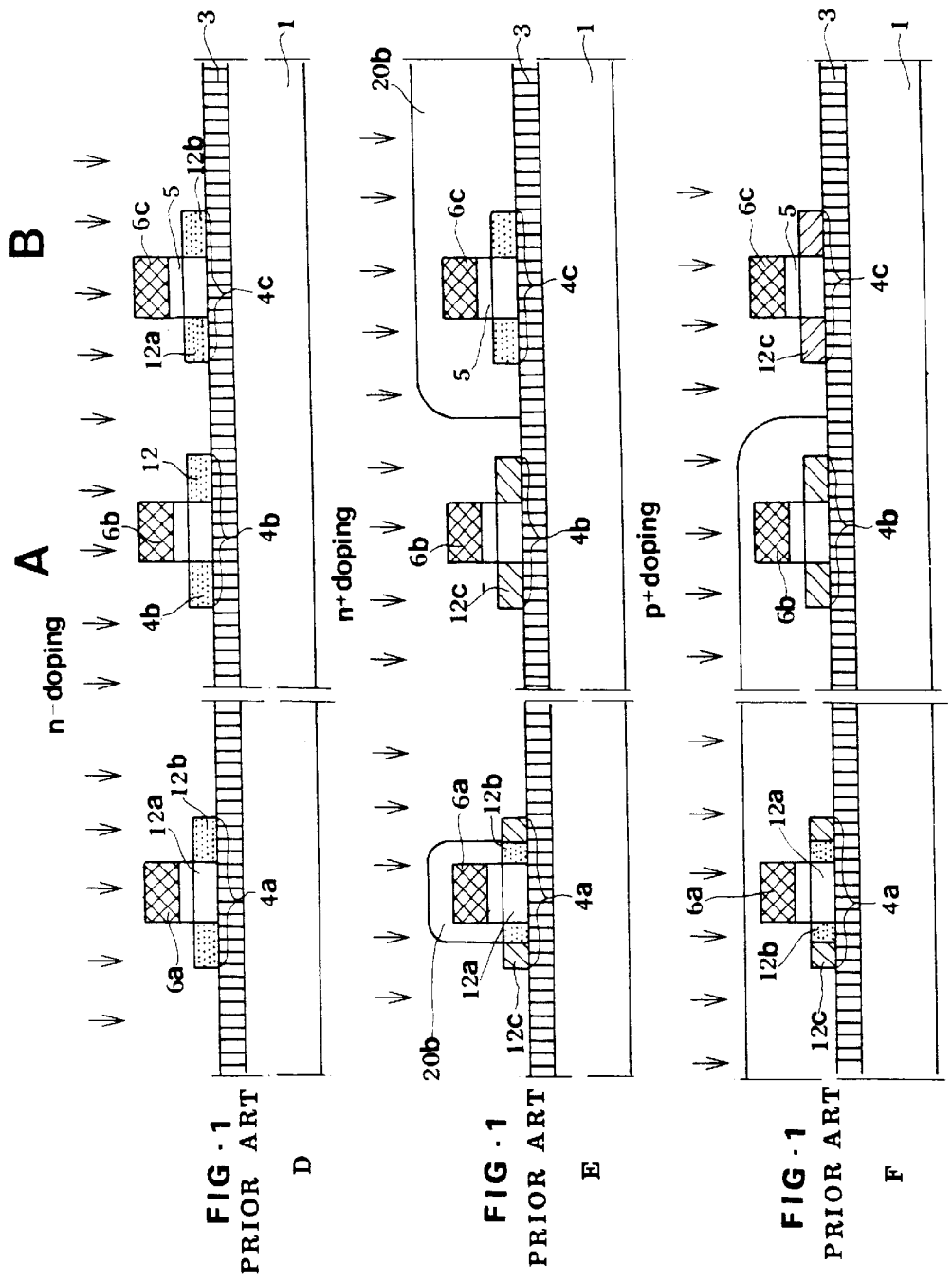

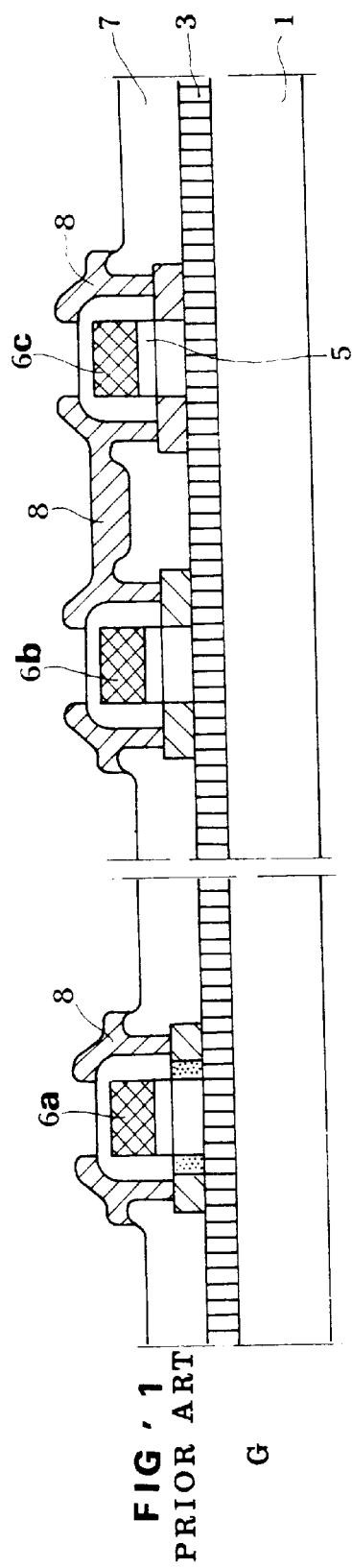
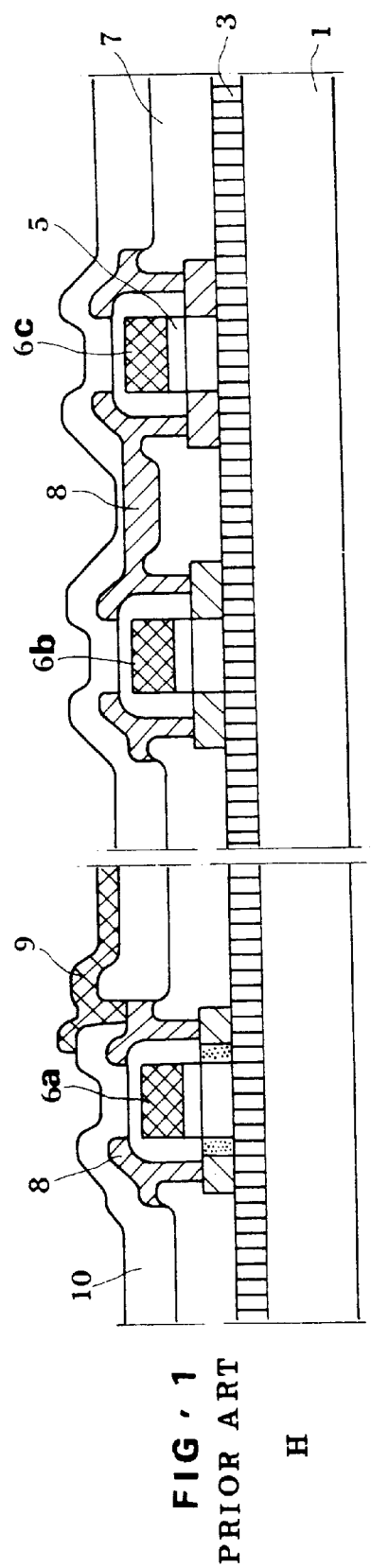
FIG. 1 PRIOR ART G
FIG. 1 PRIOR ART H

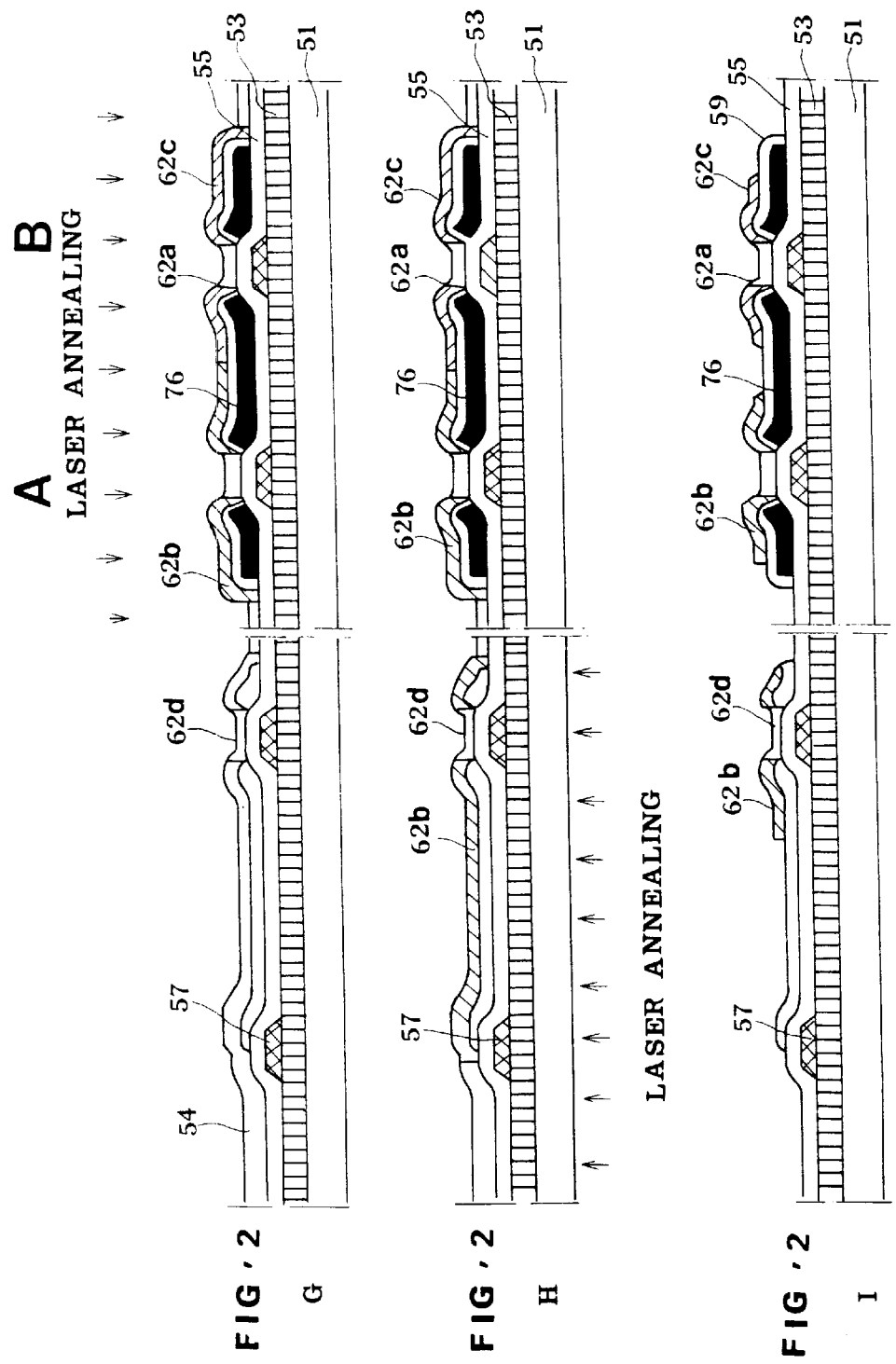

LIQUID CRYSTAL DISPLAY DEVICE INTEGRATED WITH DRIVING CIRCUIT AND METHOD FOR FABRICATING THE SAME

This application claims the benefit of Korean Application No. 15699, filed on May 11, 1996, which is hereby incorporated by reference.

BACKGROUND OF THE INVENTION

1. Field of the Invention

This invention relates to a liquid crystal display device, and more particularly, to a liquid crystal display device in which a pixel driving thin film transistor(TFT) and a driver circuit are integrated on the same panel.

2. Discussion of the Related Art

An active matrix liquid crystal display has been used for a liquid crystal display(LCD) that has large area and high resolution. Such an active matrix LCD includes pixel driving TFTs for driving pixels of the display pixels and driver circuit TFTs for applying signals to gate bus lines and data bus lines coupled to the pixel driving TFTs.

There are two types of driver circuit units. In the first type, the driver circuit unit is a separate integrated circuit chip and is attached to the substrate of a liquid crystal panel. Thus, the driver circuit is not formed on the liquid crystal panel. In the second type, the driver circuit unit is formed on the LC panel as one piece. In general, complementary metal oxide semiconductor TFTs(CMOS TFTs) using a polycrystalline silicon(p-Si) with high electric field effect mobility have been used for that purpose, with the resultant switching speed being much higher than that for amorphous silicon TFTs. Further, because the driver circuit TFTs and the pixel driving TFTs are fabricated at the same time, the manufacturing cost can be reduced.

FIGS. 1A to 1H are drawings which show a method of fabricating a conventional liquid crystal display device integrated with a driver circuit. A substrate 1 is divided into a pixel region and a driver circuit region. The driver circuit region is divided into a part A having N-channel metal oxide semiconductor TFTs(NMOS TFTs) and a part B having P-channel metal oxide semiconductor TFTs(PMOS TFTs).

As shown in FIG. 1A, a buffer layer 3 is provided on the substrate 1, and then p-Si is deposited on the buffer layer 3 and patterned to form semiconductor layers 4a, 4b, 4c in the pixel and driver circuit regions. As shown in the figure, one semiconductor layer 4a is provided in the pixel region, and two semiconductor layers 4b, 4c are formed in the driver circuit region. The semiconductor layer 4a in the pixel region is formed for a TFT for driving each pixel. The semiconductor layers 4b, 4c are formed for NMOS and PMOS TFTs, respectively.

As shown in FIG. 1B, an insulating layer 5 such as $SiO_2$ or SiNx, a metal layer 6, such as Al, Al alloy, or Cr, and a photoresist 20a are successively formed over the substrate 1. The insulating layer 5 and the metal layer 6 are patterned by photolithography to form a gate insulating layer 5 and gate electrodes 6a, 6b, 6c, as shown in FIG. 1C. Further, as shown in FIG. 1D, $n^-$ doping (doping for forming an $n^-$ layer) in low impurity-concentration is performed onto the entire surface of the substrate 1. As a result, $n^-$ layers 12b and channel layers 12a are formed in the semiconductor layers 4a, 4b, 4c. (The $n^-$ ions are blocked by the gate electrodes 6a, 6b, 6c.)

Thereafter, as shown in FIG. 1E, $n^+$ doping in high impurity-concentration is performed to form a lightly doped drain(LDD) structure after the photoresist layer 20b is deposited over the substrate and patterned to cover the part B in the driver circuit region, the gate electrode 6a, and some parts of the semiconductor layer 4a in the pixel region. In this case, the photoresist layer 20b in the pixel region blocks some parts of the gate electrode 6a and the semiconductor layer 4a so that $n^+$ type ions are introduced into only a portion of $n^-$ layer 12b. Accordingly, an $n^+$ layer 12c is formed by the $n^+$ doping in the semiconductor layers 4a of the pixel region and 4b of part A of the driver circuit region. Especially, an LDD (lightly-doped drain) structure is constructed by forming $n^+$ layer 12c with high impurity-concentration and $n^-$ layer 12b with low impurity-concentration in the semiconductor layer 4a in the pixel region.

As shown in FIG. 1F, the photoresist layer 20b is removed, and another photoresist layer 20c is deposited and patterned to block the pixel region and part A of the driver circuit region. Subsequently, high impurity-concentration $p^+$ doping is executed to form a $p^+$ layer 12d in part B of the driver circuit region.

This doping method is called a counter doping method. When the $n^-$ doping is executed, the concentration of impurity-ions doped in the semiconductor layers is about $10^{16}$–$10^{18}$ atoms/cm$^3$, whereas the concentration of impurity-ions doped in the semiconductor layer in the $p^+$ doping is about $10^{19}$–$10^{21}$ atoms/cm$^3$. Therefore, the $n^-$ layer becomes a $p^+$ layer by the $p^+$ doping (hence called counter doping).

Accordingly, TFTs having an LDD structure including the $n^+$ layers 12c and $n^-$ layers 12b are formed in the pixel region, and CMOS TFTs having NMOS TFTs including the $n^+$ layers 12c and PMOS TFTs including the $p^+$ layers 12d are formed in the driver circuit region.

As shown in FIG. 1G, after the photoresist layer 20c is removed, an insulating layer 7, such as SiNx or $SiO_2$, is deposited over the entire surface of the substrate 1. Contact holes are formed by patterning the insulating layer 7, and a metal such as Al is deposited and patterned to form source/drain electrodes 8.

As shown in FIG. 1H, a passivation layer 10 is deposited, and indium tin oxide(ITO) is deposited and patterned to form a transparent electrode 9. As a result, TFTs having LDD structures are formed in the pixel region and CMOS TFTs are formed in the driver circuit region, thereby completing a liquid crystal display device integrated with a driver circuit.

Further, an alignment layer is formed over the passivation layer 10, and is rubbed mechanically to provide an alignment direction for the liquid crystal. This completes the liquid crystal panel. Also, if necessary, a black matrix is formed to prevent light leakage from an upper substrate.

However, the above mentioned method for fabricating the liquid crystal display device integrated with a driver circuit requires complex processes, and has the problem that the source/drain electrode formed on the TFT and the metal lines are often disconnected due to defects or the like.

SUMMARY OF THE INVENTION

Accordingly, the present invention is directed to a liquid crystal display device integrated with a driving circuit and a method for fabricating the same that substantially obviate the problems due to limitations and disadvantages of the related art.

An object of the present invention is to provide a method for fabricating a liquid crystal display device integrated with a driver circuit that has a simpler manufacturing process.

Another object of the present invention is to provide a liquid crystal display device integrated with a driver circuit that has high reliability in signal and gate bus lines.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method for fabricating a pixel driving thin film transistor and a CMOS driver on a substrate for a liquid crystal display, a surface of the substrate being divided into a pixel region, an N-channel region, and a P-channel region, the method including the steps of forming a gate electrode in each of the pixel region, the N-channel region, and the P-channel region of the substrate; forming a gate insulating layer over an entire surface of the substrate including the gate electrodes; forming transparent electrodes adjacent the gate electrodes over the insulating layer; doping first impurities into the transparent electrodes located in the P-channel region; doping second impurities into the transparent electrodes located in the N-channel region and in the pixel region; forming an amorphous semiconductor layer on the transparent electrodes adjacent the gate electrodes in the pixel region, the P-channel region, and the N-channel region; directing a first radiant beam toward the P-channel region and the N-channel region to anneal the amorphous semiconductor layer in each of the P-channel and N-channel regions, the first impurities and the second impurities diffusing into the annealed amorphous semiconductor layer; and directing a second radiant beam toward the pixel region to anneal the amorphous semiconductor layer in the pixel region, the second impurities diffusing into the annealed amorphous semiconductor layer.

In another aspect, the present invention provides a thin film transistor substrate integrated with a driver circuit for use in a liquid crystal display, the thin film transistor substrate including a substrate, a surface of the substrate being divided into a pixel region and a driver region; a pixel driving thin film transistor in the pixel region, the pixel driving thin film transistor including a gate electrode, a gate insulating layer on the gate electrode, a transparent electrode, a channel region including an intrinsic amorphous semiconductor over the gate insulating layer adjacent the gate electrode, and source and drain regions in contact with the channel region, the source and drain regions including an N-type polycrystalline semiconductor and being connected to the transparent electrode; an N-channel thin film transistor in a portion of the driver region, the N-channel thin film transistor including a gate electrode, a gate insulating layer over the gate electrode, source and drain electrodes formed of a metal over the gate insulating layer adjacent the gate electrode, transparent electrodes formed on the source and drain electrodes, a channel region including an intrinsic polycrystalline semiconductor over the gate insulating layer adjacent the gate electrode, and source and drain regions including an N-type polycrystalline semiconductor formed on the transparent electrode, the source and drain regions being in contact with the channel region; a P-channel thin film transistor in a portion of the driver region, the p-channel thin film transistor including a gate electrode, a gate insulating layer over the gate electrode, source and drain electrodes formed of a metal over the gate insulating layer adjacent the gate electrode, transparent electrodes formed on the source and drain electrodes, a channel region including an intrinsic polycrystalline semiconductor over the gate insulating layer adjacent the gate electrode, and source and drain regions including a P-type polycrystalline semiconductor formed on the transparent electrode, the source and drain regions being in contact with the channel region; and a passivation layer over each of the pixel driving thin film transistors, the P-channel thin film transistor, and the N-channel thin film transistor.

In another aspect, the present invention provides a thin film transistor substrate for use in a liquid crystal display, the thin film transistor substrate including a substrate, a surface of the substrate being divided into a first region and a second region; a first thin film transistor in the first region, the first thin film transistor including a gate electrode, a gate insulating layer on the gate electrode, a transparent electrode, a channel region including intrinsic amorphous silicon over the gate insulating layer adjacent the gate electrode, and source and drain regions in contact with the channel region, the source and drain regions including N-type polycrystalline silicon and being connected to the transparent electrode; and a second thin film transistor in the second region, the second thin film transistor including a gate electrode, a gate insulating layer over the gate electrode, source and drain electrodes formed of a metal over the gate insulating layer adjacent the gate electrode, a transparent electrode formed on the source and drain electrodes, a channel region including an intrinsic polycrystalline silicon over the gate insulating layer adjacent the gate electrode, and source and drain regions including N-type polycrystalline silicon formed on the transparent electrode, the source and drain regions being in contact with the channel region.

In a further aspect, the present invention provides a method of manufacturing a liquid crystal display device integrated with a driver circuit includes the steps of forming a gate electrode by depositing and patterning a metal layer covered on the surface of a buffer layer provided over a substrate having a pixel region and a driver circuit region, depositing a gate insulating layer over the entire surface of substrate with the gate electrode, forming a metal line by depositing and patterning a metal on the driver circuit region, forming a pixel electrode by depositing a transparent electrode, doping P type impurities in state that the pixel region and the gate electrode on part B of the driver circuit region and part A of the driver circuit region are blocked by depositing and patterning a photoresist, doping N type impurities in state that part B of the driver circuit region and the gate electrode of the pixel region and the gate electrode of part A of the driver circuit region are blocked by depositing and patterning another photoresist after the former (photoresist) is removed, forming an amorphous silicon layer, annealing by laser irradiation for the driver circuit region and the pixel region, forming both pixel driving TFTs and CMOS TFTs by patterning the semiconductor layers, forming a passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A to 1H are drawings showing a method of fabricating a conventional liquid crystal display device integrated with a driver circuit.

DETAILED DESCRIPTION OF THE PREFERRED EMBODIMENTS

Reference will now be made in detail to the preferred embodiments of the present invention, examples of which are illustrated in the accompanying drawings.

FIG. 2A to FIG. 2J are drawings showing a method for fabricating a liquid crystal display device integrated with a driver circuit according to the present embodiment. This embodiment has a hybrid structure in that TFTs in a pixel region employ amorphous silicon(a-Si) and TFTs in a driver circuit region are CMOS TFTs using polycrystalline silicon (p-Si). A substrate 51 is divided into a pixel region and a driver circuit region. The pixel region includes the pixel driving TFTs made of a-Si to apply a video signal from the driver circuit to a pixel electrode. The driver circuit region includes CMOS TFTs to apply the video signal to each pixel driving TFT. Also, the CMOS TFTs control ON/OFF of the pixel driving TFTs. The driver circuit region is divided into a part A having NMOS TFTs and a part B having PMOS TFTs.

Figure 2A:
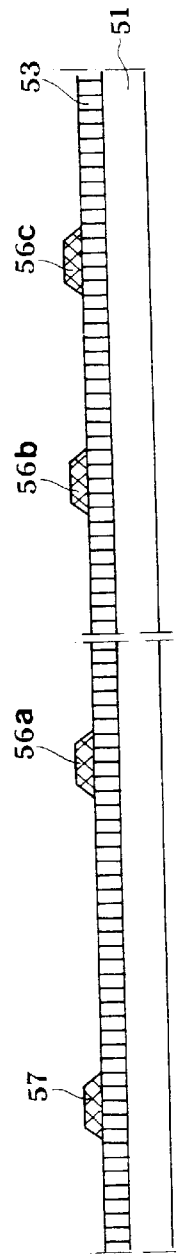
FIGS. 2A to 2J are drawings showing a method of fabricating a liquid crystal display device integrated with a driver circuit according to the present invention.
Figure 2B:
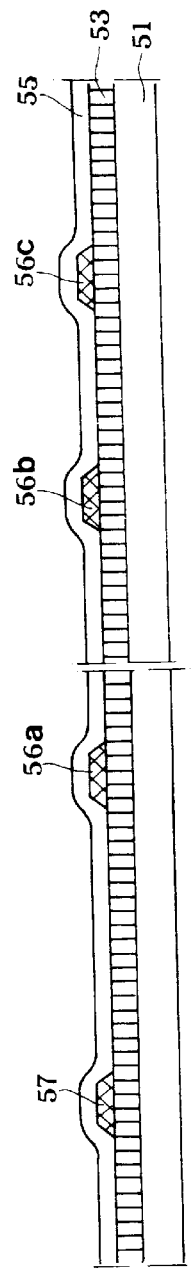
Figure 2C:
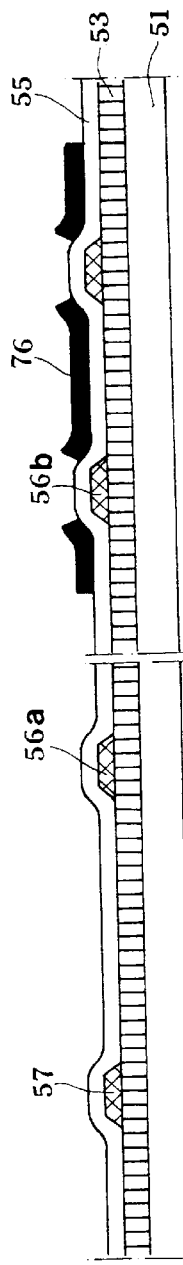

As shown in FIG. 2A, a conductive layer (or metal), such as Al or Cr, is deposited on a buffer layer 53 over a substrate 51 and patterned to form gate electrodes 56a, 56b, 56c and a gate line 57. As shown in FIG. 2B, a gate insulating layer 55 including $SiO_2$ is deposited over the entire surface of the substrate 51. After contact holes (not illustrated) are formed at a connection portion of a metal line on the driver circuit region, a metal such as Mo is deposited on the gate insulating layer 55 and patterned to form a metal layer 76, as shown in FIG. 2C. Although not shown in the Figure, the metal layer 76 may also be formed in the pixel region if desired. As will be described below, these lines will have a double layered structure to prevent line disconnection.

Figures 2D, 2E, 2F:
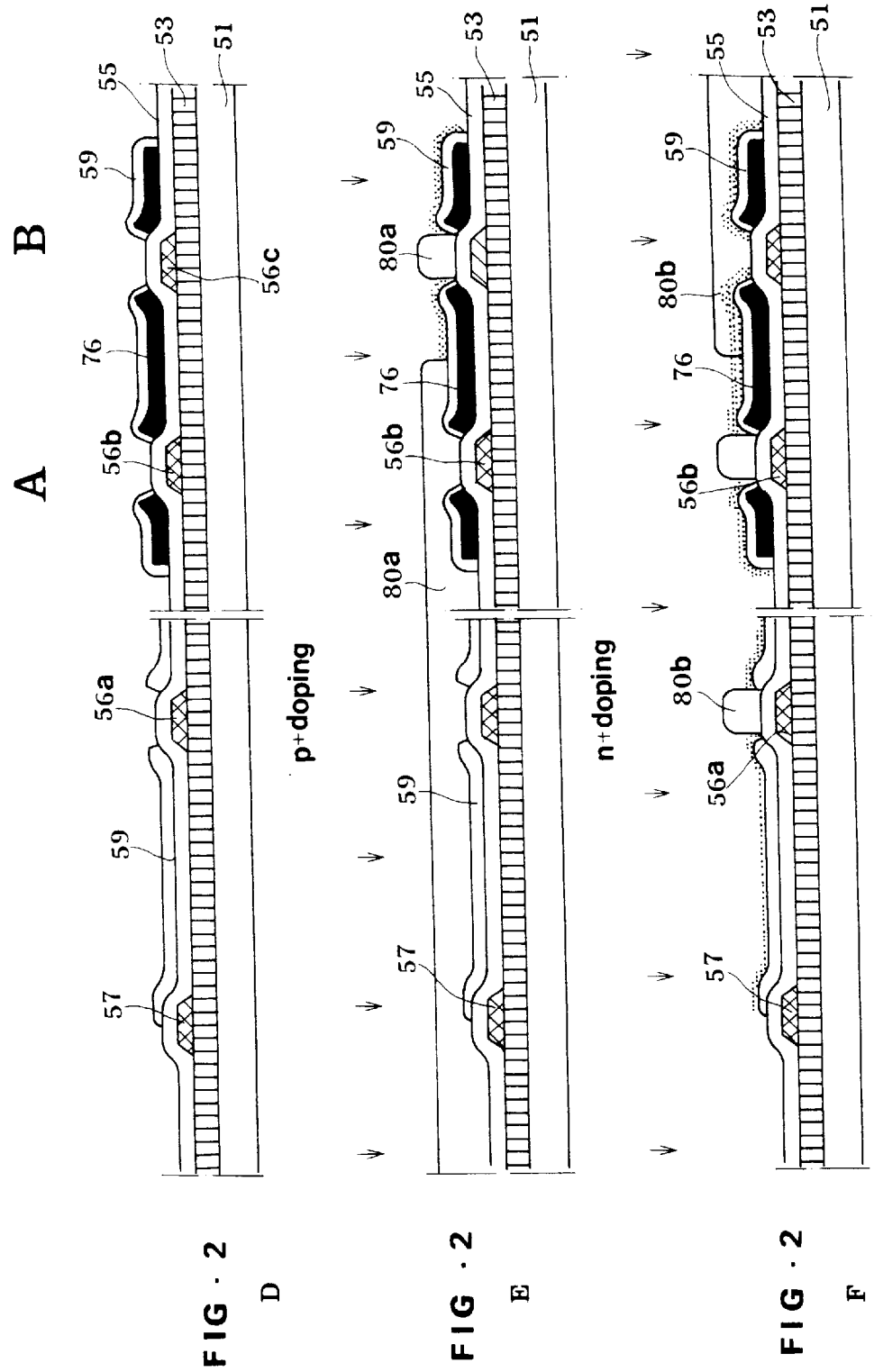
Figure 2:
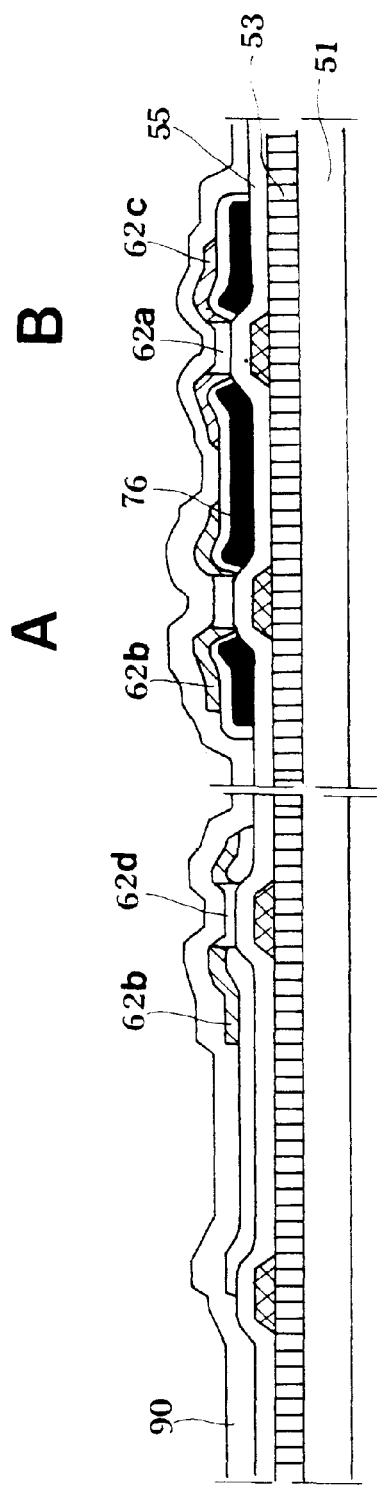

Thereafter, transparent electrode material such as ITO is deposited and patterned to form a transparent electrode 59 as shown in FIG. 2D. The transparent electrode 59 is formed on the metal layer 76 of the driver circuit region (and the pixel region, if any), on the source/drain regions of the pixel driving TFT, and over the gate line 57. The transparent electrode 59 on the metal layer 76 is formed to cover the entire edges of the metal layer 76 so that good ohmic contact can be obtained with an impurity-doped semiconductor layer to be formed thereon. The signal generated by the driver circuit is to be applied to the transparent electrode 59 in the pixel region. Thus, this transparent electrode serves as a pixel electrode. In this construction, the metal layer 76 is covered by the transparent electrode 59 (at least in the driver circuit region), forming a double-layered structure. This improves reliability of the electrode.

Further, as shown in FIG. 2E, $p^+$ doping is performed after a photoresist layer 80a is deposited and patterned to block the pixel region, part A of the driver circuit region and a gate electrode 56c of part B of the driver circuit region. This ion doping process is conducted by an ion shower doping method using $B_2H_6/H_2$ gas, for example. Although the ions are slightly doped in the inside of the transparent electrode 59 in part B of the driver circuit region, most of the ions($B^+$) remain on the transparent electrode 59.

Further, as shown in FIG. 2F, the photoresist layer 80a is removed, and another photoresist layer 80b is deposited and patterned to block the part B of the driver circuit region and a gate electrode 56b of the part A of the driver circuit region and a gate electrode 56a of the pixel region. Thereafter, $n^+$ doping is executed. This ion doping process is also conducted through an ion shower doping method using $PH_3/H_2$ gas, and most of the impurity-ions ($P^+$, for example) remain on the transparent electrode.

As a result, by this $n^+$ doping, the N type impurity-ions ($P^+$) are left on the transparent electrodes 59 in the pixel region and part A of the driver circuit region, and the P type ions ($B^+$) are left on the transparent electrode 59 of part B of the driver circuit region by $p^+$ doping.

As shown in FIG. 2G, the photoresist layer 80b is removed and a semiconductor layer 54 made of a-Si, for example, is deposited over the entire surface of the substrate 51. Then, laser annealing is selectively performed from the upper side of the substrate 51 to the driver circuit region. For example, an excimer laser can be used in this process. The a-Si layer in the driver circuit region is transformed into a p-Si layer by this laser annealing, and N type ions and P type ions on the transparent electrode 59 diffuse into the p-Si layer in part A and part B of the driver circuit region, whereby an N type p-Si layer 62b is formed in the part A and a P type p-Si layer 62c is formed in the part B.

On the other hand, portions of the semiconductor layer positioned over the gate electrodes 56b, 56c of part A and part B of the driver circuit region are transformed into channel layers 62a including intrinsic p-Si layer, because no impurity-diffusion takes place there.

As, as shown in FIG. 2H, an excimer laser beam is directed to the pixel region from the rear side of the substrate, and the a-Si layer is transformed into a p-Si layer. At the same time, $n^+$ layer made of the p-Si layer is formed by N-type ions($p^+$) diffused into the semiconductor layer. Here, as shown in the figure, a semiconductor layer located over the gate electrode 56a remains nearly unaffected because exposure to the laser beam is blocked by the gate electrode 56a. Accordingly, the channel layer 62d made of a-Si layer and the $n^+$ layer 62b including a polycrystalline semiconductor layer are formed in the pixel region.

Further, as shown in FIG. 2I, after patterning the semiconductor layer 54, a CMOS TFT made of P-Si having the NMOS TFT and the PMOS TFT is formed in the driver circuit region, and the pixel driving TFT having the channel layer made of the intrinsic a-Si and the ohmic layer made of the N-type p-Si is formed in the pixel region, whereby a liquid crystal display panel having hybrid structure is completed.

As shown in FIG. 2J, a liquid crystal device integrated with a driver circuit in accordance with the present invention is completed by depositing a passivation layer 90 formed of an insulating layer such as SiNx. When the passivation 90 including a large amount of hydrogen is deposited and annealed by heat-treatment, the hydrogen included in the passivation layer diffuses into the channel layer of each TFT of the driver circuit region and the pixel region. Since the hydrogen atoms diffusing into the channel layer have a large diffusion coefficient, the hydrogen atoms are easily movable and an interfacial character between the channel layer and the gate insulating layer can be improved. This is because hydrogen can reduce defects and/or carrier traps, as is well known. Therefore, characteristics of the transistors can be improved.

According to the present invention, because the laser beam is radiated toward the semiconductor layer made of a-Si layer, the p-Si CMOS TFTs each having both the NMOS TFT and the PMOS TFT and the pixel driving TFTs each having the channel layer made of a-Si and the ohmic layer (source and drain regions) made of p-Si are formed on the driver circuit region and the pixel region, respectively, at the same time.

Also the interfacial character between the channel layer and the gate insulating layer is improved by hydrogen contained in the passivation layer.

Further, bus lines are free from disconnection because the metal line formed in the driver circuit region is doubly layered.

It will be apparent to those skilled in the art that various modifications and variations can be made in the liquid crystal display device integrated with driving circuit and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A thin film transistor substrate for use in a liquid crystal display, the thin film transistor substrate comprising:

a substrate, a surface of the substrate being divided into a first region and a second region;

a first thin film transistor in the first region, the first thin film transistor including a gate electrode, a gate insulating layer on the gate electrode, first and second transparent electrodes, a channel region including a substantially intrinsic amorphous silicon over the gate insulating layer adjacent the gate electrode, and source and drain regions in contact with the channel region, the source and drain regions each including polycrystalline silicon and being connected to the first and second transparent electrodes, respectively; and a second thin film transistor in the second region, the second thin film transistor including a gate electrode, a gate insulating layer over the gate electrode, source and drain electrodes each formed of a metal over the gate insulating layer adjacent the gate electrode, third and fourth transparent electrodes formed on the source and drain electrodes, respectively, a channel region including a substantially intrinsic polycrystalline silicon over the gate insulating layer adjacent the gate electrode, and source and drain regions each including polycrystalline silicon formed on the third and fourth transparent electrodes, respectively, the source and drain regions being in contact with the channel region.

2. A thin film transistor substrate integrated with a driver circuit for use in a liquid crystal display, the thin film transistor substrate comprising:

a substrate, a surface of the substrate being divided into a pixel region and a driver region;

a plurality of pixel driving thin film transistors formed in the pixel region, each of the plurality of pixel driving thin film transistors including a channel region formed of an amorphous semiconductor, source and drain regions in contact with the channel region and each formed of a polycrystalline semiconductor, and first and second transparent electrodes in contact with the source and drain regions, respectively; and a CMOS thin film transistor circuit formed in the driver region, including a P-type thin film transistor and an N-type thin film transistor, each of the P-type and N-type thin film transistors including a channel region formed of a polycrystalline semiconductor, source and drain regions in contact with the channel region and formed of a polycrystalline semiconductor, third and fourth transparent electrodes in contact with the source and drain regions, respectively, and source and drain electrodes in contact with the third and fourth transparent electrodes, respectively, the source and drain electrodes being connected to the source and drain regions through the third and fourth transparent electrodes, respectively.

3. The thin film transistor substrate according to claim 2, wherein the polycrystalline semiconductors and the amorphous semiconductors are each formed of silicon.

4. A thin film transistor substrate integrated with a driver circuit for use in a liquid crystal display, the thin film transistor substrate comprising:

a substrate, a surface of the substrate being divided into a pixel region and a driver region;

a pixel driving thin film transistor in the pixel region, the pixel driving thin film transistor including a gate electrode, a gate insulating layer on the gate electrode, first and second transparent electrodes over the gate insulating layer, a channel region including a substantially intrinsic amorphous semiconductor over the gate insulating layer adjacent the gate electrode, and source and drain regions in contact with the channel region, the source and drain regions each including an N-type polycrystalline semiconductor and being connected to the first and second transparent electrodes, respectively;

an N-channel thin film transistor in a portion of the driver region, the N-channel thin film transistor including a gate electrode, a gate insulating layer over the gate electrode, source and drain electrodes each formed of a metal over the gate insulating layer adjacent the gate electrode, third and fourth transparent electrodes formed on the source and drain electrodes, respectively, a channel region including a substantially intrinsic polycrystalline semiconductor over the gate insulating layer adjacent the gate electrode, and source and drain regions each including an N-type polycrystalline semiconductor formed on the third and fourth transparent electrodes, respectively, the source and drain regions being in contact with the channel region;

a P-channel thin film transistor in a portion of the driver region, the p-channel thin film transistor including a gate electrode, a gate insulating layer over the gate electrode, source and drain electrodes each formed of a metal over the gate insulating layer adjacent the gate electrode, fifth and sixth transparent electrodes formed on the source and drain electrodes, respectively, a channel region including a substantially intrinsic polycrystalline semiconductor over the gate insulating layer adjacent the gate electrode, and source and drain regions each including a P-type polycrystalline semiconductor formed on the fifth and sixth transparent electrodes, respectively, the source and drain regions being in contact with the channel region; and a passivation layer over each of the pixel driving thin film transistor, the P-channel thin film transistor, and the N-channel thin film transistor.

5. The thin film transistor substrate according to claim 4, wherein the transparent electrodes in each of the pixel driving thin film transistor, the N-channel thin film transistor, and the P-channel thin film transistor include indium tin oxide.

6. The thin film transistor substrate according to claim 4, wherein the source and drain electrodes in each of the N-channel thin film transistor and the P-channel thin film transistor include Mo.

7. The thin film transistor substrate according to claim 4, wherein the transparent electrodes in each of the N-channel thin film transistor and the P-channel thin film transistor cover the edges of the corresponding source and drain electrodes.

* * * * *